(12) United States Patent
Cobos Marquez

(10) Patent No.: US 11,990,844 B2
(45) Date of Patent: May 21, 2024

(54) DIRECT ELECTRICAL POWER CONVERTER

(71) Applicant: Differential Power, SL, Madrid (ES)

(72) Inventor: Jose Antonio Cobos Marquez, Madrid (ES)

(73) Assignee: Differential Power, S.L., Madrid (ES)

(*) Notice: Subject to any disclaimer, the term of this patent is extended or adjusted under 35 U.S.C. 154(b) by 220 days.

(21) Appl. No.: 17/776,290

(22) PCT Filed: Oct. 26, 2020

(86) PCT No.: PCT/EP2020/080027
§ 371 (c)(1),
(2) Date: May 12, 2022

(87) PCT Pub. No.: WO2021/094077
PCT Pub. Date: May 20, 2021

(65) Prior Publication Data
US 2022/0416674 A1     Dec. 29, 2022

(30) Foreign Application Priority Data
Nov. 15, 2019  (EP) .................................. 19383008

(51) Int. Cl.
*H02M 3/335* (2006.01)
*H02M 1/00* (2006.01)

(52) U.S. Cl.
CPC ..... *H02M 3/33584* (2013.01); *H02M 1/0058* (2021.05)

(58) Field of Classification Search
CPC ............... H02M 1/0058; H02M 3/335; H02M 3/33538; H02M 3/33546; H02M 3/33584
See application file for complete search history.

(56) References Cited

U.S. PATENT DOCUMENTS

| 4,561,046 A | 12/1985 | Kuster |
| 4,736,284 A | 4/1988 | Yamagishi et al. |

(Continued)

FOREIGN PATENT DOCUMENTS

| EP | 1115203 | 7/2011 |
| JP | 2011130552 | 6/2011 |

OTHER PUBLICATIONS

Chen Guipeng et al.; Single coupled-inductor dual output soft-switching DC-DC converters with improved cross-regulation and reduced components; IET Power Electronics, IET, UK; vol. 10, No. 13; Oct. 27, 2017; pp. 1665-1678.

(Continued)

*Primary Examiner* — Gary L Laxton
(74) *Attorney, Agent, or Firm* — Allen, Dyer, Doppelt & Gilchrist, P.A.

(57) ABSTRACT

A direct electrical power converter, DPX, that connects a primary port including a DC or AC energy source, with a secondary port including a DC or AC load, comprising a transformer or autotransformer; a first power switch between two nodes, having two power terminals and a first control terminal; and a second power switch between other different two nodes having two power terminals, and a second control terminal wherein said switches are configured to connect the primary port energy source to the secondary port load, through the transformer or autotransformer. The cited first and second power switches are configured to be operated simultaneously under the action of a logic control signal providing a conducting status with all 10 the power switches being simultaneously in an On state or with all the power switches simultaneously in an Off state, connecting or disconnecting said transformer to said primary port and said secondary ports simultaneously.

17 Claims, 19 Drawing Sheets

(56) References Cited

U.S. PATENT DOCUMENTS

| | | |
|---|---|---|
| 5,521,807 A | 5/1996 | Chen et al. |
| 2003/0090237 A1 | 5/2003 | Shenai |
| 2004/0052094 A1 | 3/2004 | Bottrill |
| 2011/0062782 A1* | 3/2011 | Coley ............... H02M 3/33538 363/21.05 |
| 2013/0181723 A1 | 7/2013 | Mauder et al. |
| 2015/0214846 A1 | 7/2015 | Cohen |
| 2017/0194868 A1 | 7/2017 | Choudhary |

OTHER PUBLICATIONS

European Patent Office; International Search Report and Written Opinion for PCT/EP2020/080027; Jan. 21, 2021; entire document.
Moore et al.; Basic Considerations for DC to DC Conversion Networks; IEEE Transactions on Magnetics; vol. Mag-2, No. 3, pp. 620-624, Sep. 1966.
Wolaver; Fundamental Study of DC to DC Conversion Systems; Massachusetts Institute of Technology, Jan. 22, 1969, entire document.

* cited by examiner

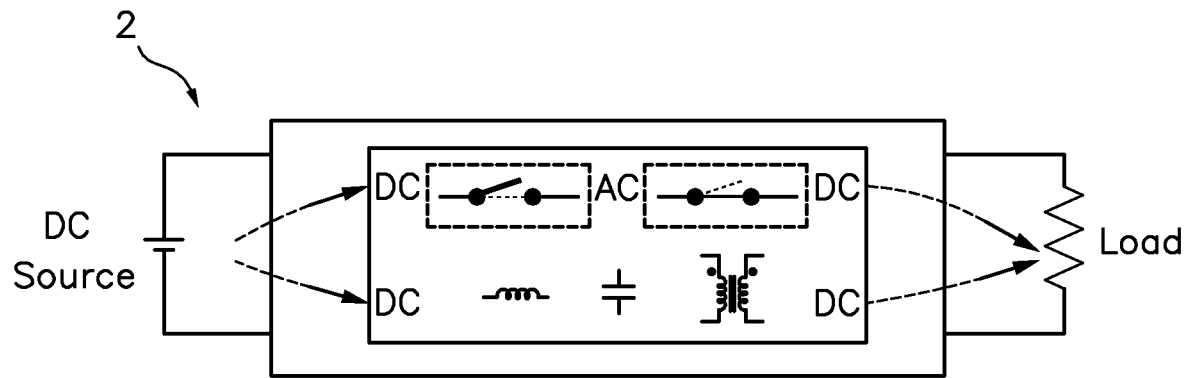
*Fig.1 Prior Art*
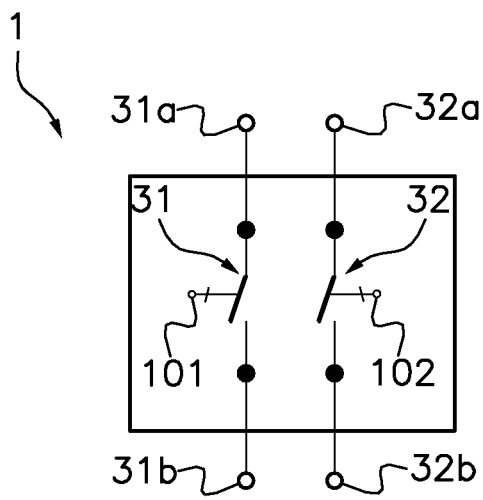 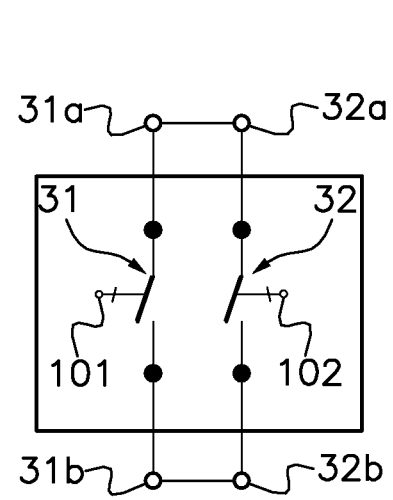
*Fig.2A Prior Art*     *Fig.2B Prior Art*

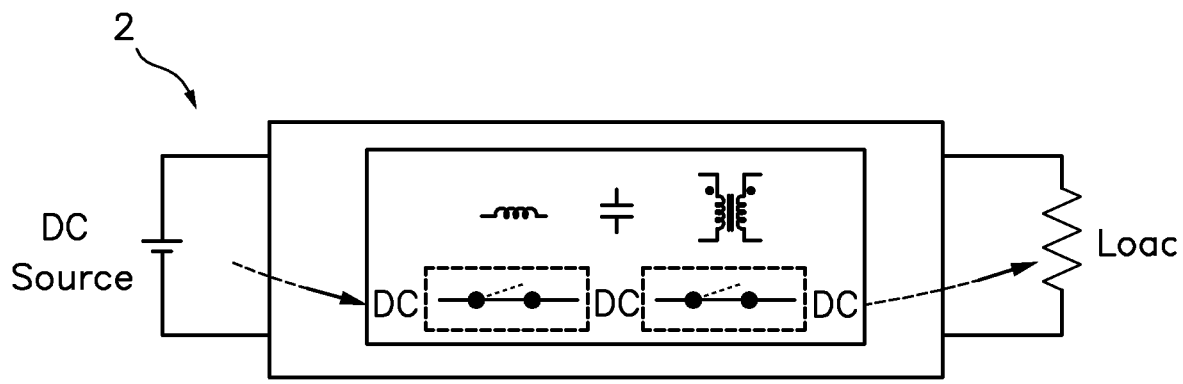
Fig.3A
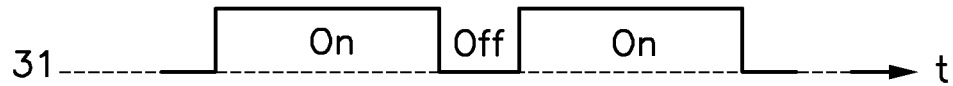
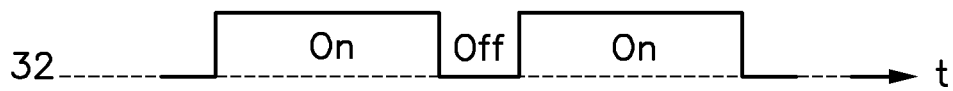
Fig.3B
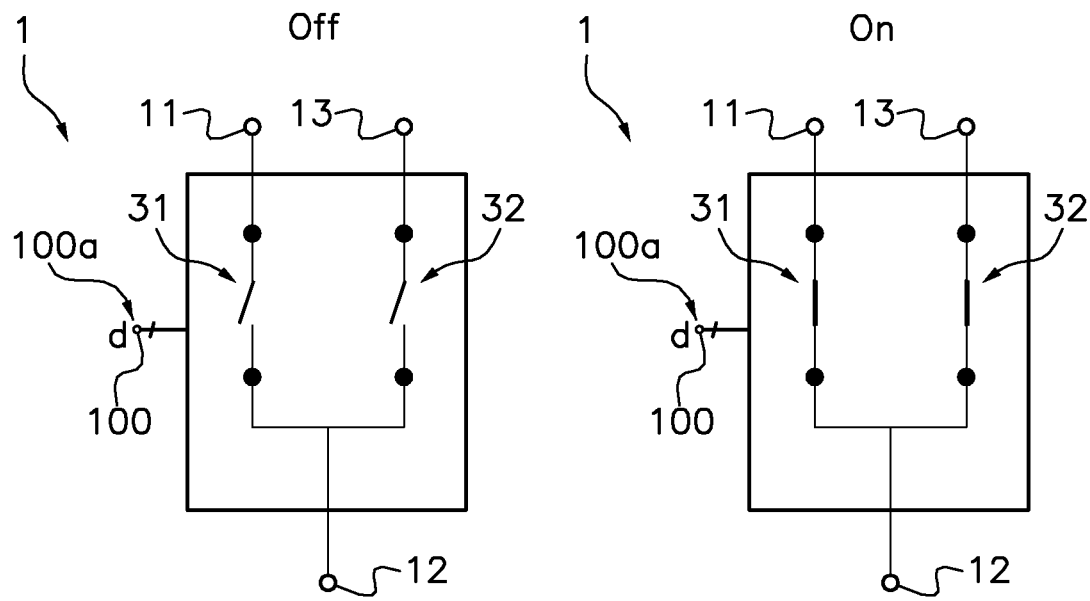
Fig.4

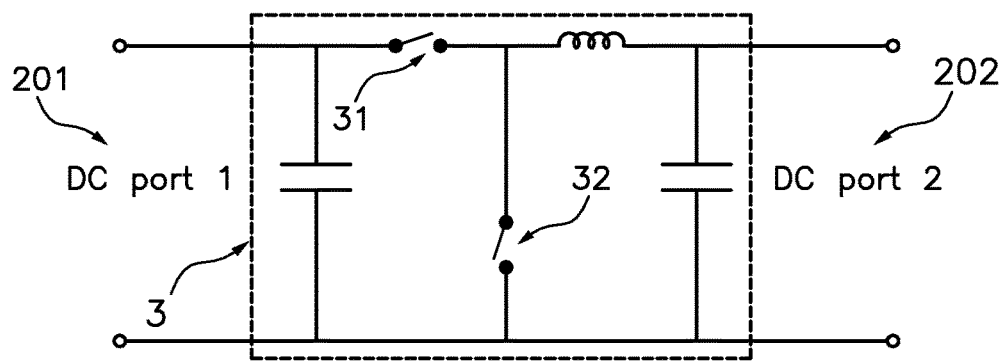
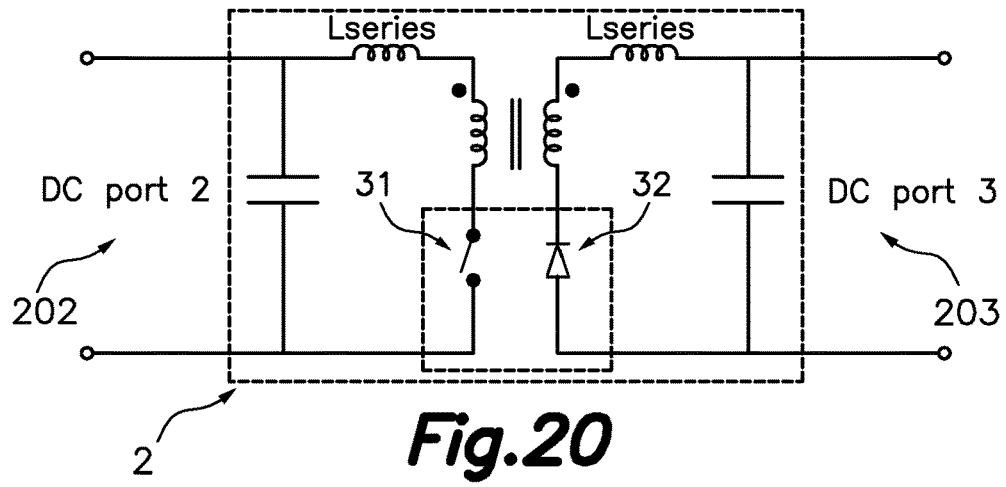
Fig.20
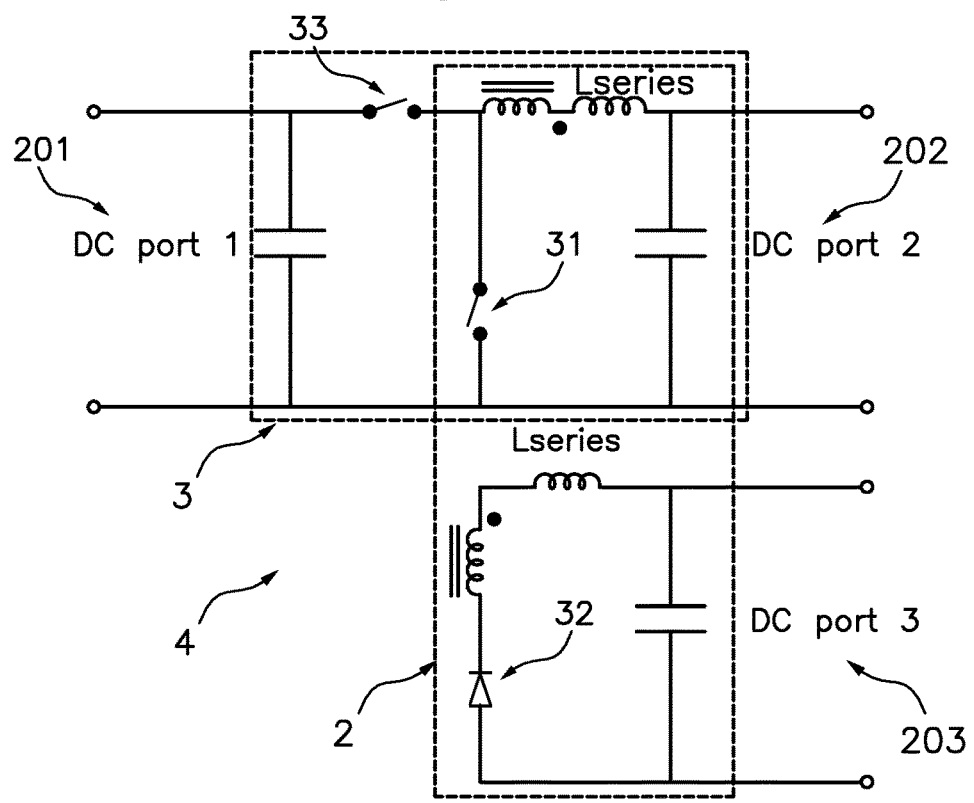
Fig.21

DIRECT ELECTRICAL POWER CONVERTER

TECHNICAL FIELD

The present invention refers in a first aspect to an electrical power converter including a transformer or autotransformer to connect a primary port with a secondary port, the primary port including a DC energy source or an AC energy source and the secondary port including a DC load or an AC load.

Therefore, the invention is in the field of the electrical power converters which process electrical power from a DC or an AC input energy source to a DC or AC load output where power may flow bi-directionally just exchanging the energy source and the load.

The DC/DC power conversion cells may be used to implement DC/AC, AC/AC and AC/DC electrical power converters.

In this description, the concept of Figure of Merit in electrical power converters is used, according to the following definition:

A typical Figure of Merit (FOM) of high-density electrical power converters is "power losses" times "volume". A more specific FOM for high current converters is "conduction power losses in the power switches" times "footprint of the power switches". Assuming all the power switches in a dc-port of the DC-DC converter have the same area, the simplified $FOM^*_{port}$ may be normalized as $FOM_{port}$ as follows:

$$FOM^*_{port} = N \sum_j i^2_{j\_rms}$$

$$FOM_{port} = N \frac{\sum_j i^2_{j\_rms}}{I^2_{port}}$$

Accounting j for each power switch in that DC port (either inverting power switches or rectifying power switches) and being $i_{j\_rms}$ the rms value of the current flowing through each power switch and $I_{port}$ the mean value flowing into or out of each DC port.

The invention further refers in a second aspect to a three-power-terminal power switch device, 3PTPS, suitable for a plurality of electrical power converter topologies.

While the invention refers to a three-power-terminal power switch additional power switch implementations involving four or more additional power terminals are also embraced by this description.

STATE OF THE ART

In 1966 E. T. Moore and T. G. Wilson published a fundamental paper titled "Basic Considerations for DC to DC Conversion Networks". In 1969, PhD Dan Holden Wolaver, from Massachusetts Institute of Technology made available to the public his Doctoral Dissertation, the "Fundamental study of DC to DC conversion systems." Both works show that in switched mode DC-DC converters, it is known that there is at least one power switch that generates "ac" or "indirect" power and at least one power switch that rectifies the "ac" power into "dc" power again. At that time, power switches were expressed as variable resistances. "Rac" and "Rdc" refer to the inverting power switch and the rectifying power switch.

These power switches are in On and Off states alternately, which implies that at least one of the power switches operates with duty cycle lower or equal than 50%.

Typical switch mode power supply topologies of electrical power converters are Buck, Boost, Buck-Boost, Sepic/Cuk, Zeta, Flyback and two power switch Flyback, active clamp/single power switch/two power switch forward, push-pull, Weinberg, half-bridge, full-bridge, phase-shifted full-bridge, resonant LLC, and many other converters more sophisticated in the state of the art.

The current need for small, high performance and efficient electrical power converters is increasing due to the high power demanded by sophisticated loads as microprocessors, CPUs, GPUs and XPUs in general, including artificial intelligent integrated circuits, and electrical installations of services appliances, electrical vehicles, communications and others.

Switched mode DC-DC electrical power converters, including DC-AC, AC-DC and ac-ac electrical power converters composed of quasi-static DC-DC cells, include two power switches or more. Power switches include power transistors (controllable device) and power diodes (non-controllable device). One of the power switches (the controllable device) generates the "ac power", also known as "indirect power", required to implement voltage (or current) gain regulation. The second power switch (diode or transistor in unidirectional electrical power converters or transistor in bi-directional converters) is required to rectify that "ac" or "indirect" power and supply it to the output port.

The basic cells of DC-DC electrical power converters are Buck (step-down). Boost (step-up) and Buck-boost (step up/down), in which the two power switches do not conduct simultaneously.

The duty cycle "d" is defined as the fraction of time that the power switch is On (ton), relative to the switching period (T), that is, d=ton/T. Since both power switches are On in alternate times and not simultaneously, the duty cycle of at least one of the power switches is lower or equal than 50%.

A large variety of co-packaged two-power-terminal power switches are commercially available. Those power switches are driven independently and are driven in power supplies alternately.

In some cases, the two alternate switches are driven with a single logic control signal since their On and Off states are determined by complementary logic.

In some other cases, two power switches are connected in parallel, performing as a single two-power-terminal power switch with better performance (i.e. on-resistance) than single power switches.

The present invention is not related with the known dual power switch configuration illustrated in FIG. 2B because compared with the three-power-terminal power switch embodiment of this invention the difference is that in this last all the power switches of an electrical power converter are configured to be operated in On state simultaneously and in Off state simultaneously therefore under the action of a single logic control signal (100*a*), i.e. all the different power switches are in an On state simultaneously or in an Off state simultaneously.

US 2003090237, JP 2011130552, EP 1115203 and US 2013181723 disclose three power terminal power switch devices in which all power switches are not operated simultaneously in an On state or in an Off state.

In the US 2003090237 switches 128 and 130 (see FIG. 1) are operated out of phase, i.e. alternately, by one logic control signal, e.g. a single gate driver. This is possible because switches 128 and 130 are of different type (N-channel and P-channel), and one switch 128 is switched on with a high logic level and the other 130 with a low logic level.

In U.S. Pat. Nos. 4,561,046 and 5,521,807, a strategy for "resonant reset" of the transformer is implemented. In both cases, additional circuitry compared to this invention is necessary for the circuit to operate. In U.S. Pat. No. 4,561,046, there is at least an LC output filter and a diode, which store and deliver AC energy and facilitates voltage regulation. In U.S. Pat. No. 5,521,807, there is at least an auxiliary winding in a "flyback" connection which is in charge of demagnetizing the transformer.

In the state of the art, being $d_{ac}$ and $d_{dc}$ the duty cycle of the power switches of the alternate switches of a basic cell, $d_{ac}+d_{dc} \leq 1$ always applies, because the power switches do not conduct simultaneously, but alternately.

Prior art power topologies use alternate power switches and therefore the optimum FOM (the lower the better) of the power switches in the input and output ports cannot be chosen independently. FIG. 3C shows that the best FOM is obtained for high values of the duty cycle (i.e. 90%) (Point B). In prior art converters, if a high duty cycle is selected for one of the ports (input or output) then the other port (output or input) is operated with low duty cycle (i.e. 10%) with a worse (higher) FOM (Point A).

On the contrary, in this invention the switches of input and output ports may both be operated with a good FOM (with d>50%, i.e. 90%) because both switches are in On state simultaneously and Off state simultaneously.

In the present invention, the resonant reset demagnetization takes place between the magnetizing inductance and the parasitic (or added) capacitances, and do not require any of the extra circuits of the above.

BRIEF DESCRIPTION OF THE INVENTION

The invention refers to an electrical power converter, configured to connect a primary port with a secondary port, the primary port including a DC energy source or an AC energy source and the secondary port including a DC load or an AC load, according to the referred state of the art, and therefore comprising:
  a transformer or autotransformer, and optionally a passive network of capacitors, inductors, or resistors, connected to a plurality of nodes of the electrical power converter;
  a first power switch between two nodes of said plurality of nodes, the first power switch having two power terminals and at least a first control terminal; and
  at least a second power switch between another two different nodes of said plurality of nodes, the at least second power switch having two power terminals and at least a second control terminal;
wherein said first power switch and said at least second power switch are configured to interconnect the cited plurality of nodes; and
wherein said at least first and second control terminals of the first and second power switches are different terminals or a single terminal.

According to this invention the cited first and second power switches connect the input DC or AC port, energy source, to the output DC or AC load through the transformer or autotransformer, providing power transfer only through a DC path, without generation and non-storage of "AC power" to regulate the power conversion, and these power switches are configured to be operated under the action of a logic control signal providing a conducting status with all the power switches being simultaneously in an On state or all the power switches being simultaneously in an Off state, connecting or disconnecting said transformer or autotransformer to said primary port and said secondary ports simultaneously, and forming a Direct Electrical power converter, DPX.

Under these conditions in a given period of time, in which said power switches are simultaneously activated, an On state time of all the power switches provides a conduction duty cycle even higher than fifty percent in all the power switches, thereby reducing the RMS value of a current flowing through the power switches for given average converter input and output currents.

In an embodiment, the referred first and second power switches are integrated in a single structure of three power terminals, and the first and second power switches are connected together in a common node. The cited structure provides a three-power-terminal power switch device with a single control terminal of the three-power-terminal power switch device that substitutes the control terminals of the first and second power switches. The logic control signal is applied to said single control terminal of the device.

There is a great diversity of circuit topologies of the power stage which include additional power switches, either transistors or diodes, and may include transformers. Typical circuit topologies are "Flyback", "Forward", "Push-pull", "Half-Bridge" and "Full-Bridge". There are also "Current-fed" versions of these circuit topologies and "resonant versions" of the same. There is also a diversity of output filters, including C filter, LC filter and "Current doubler". Some additional active or passive networks may be added to achieve soft-switching (Zero-voltage or Zero-current switching). In some cases, several basic cells are interconnected and simplified by eliminating some redundant power switches, like the Sepic, Cuk or Zeta converters. They may also include transformers in their structure.

The common characteristic of all of them is that they do not operate all the power switches with d>50%. Even in the case of having all minus one switching with d>50%, there is at least one power switch operated with d<50%. One limit case is to have all power switches operating at 50%. There are no switched mode electrical power converters in which d>50% for all the power switches of the power topology.

In the proposed invention, the inverting and rectifying power switches do not exist, because no AC power is required to provide the DC-DC conversion (see FIG. 3A).

On the contrary, the power flows directly from input to output through a magnetic component and the voltage conversion is implemented by the transformer or autotransformer turns ratio, which is connected to input and output ports simultaneously through both power switches in the DC path in FIG. 3A, rather than in the AC path (see FIG. 1).

In this way, all the involved power switches that are simultaneously activated providing power transfer through a DC path may be operated with duty cycle higher than 50%. The transformer or autotransformer magnetization during the On state is reset during the Off state by means of a resonance between the magnetizing inductance of the transformer or autotransformer and the parasitic (or added in parallel) capacitances of the power switches.

In an embodiment, the electrical power converter includes additional control means configured to provide an additional timing control allowing to advance or delay the physical driving signal with respect to the logic control signal applied to each of the power switches during the power switch transitions between said On and Off states to reduce switching losses.

In an embodiment, the first power switch and/or the second power switch is/are inserted in the windings of the transformer or autotransformer or in a part thereof, coupled in the same magnetic component.

The first and second power switches of the electrical power converter are all controlled switches implemented with transistors or comprise at least one controlled switch implemented with a transistor and at least one non-controlled switch implemented with diodes.

Alternatively, the first and second power switches are implemented with electromechanical devices.

In addition, the On state time of the power switches of the electrical power converter should be long enough to provide a current through a secondary winding of the transformer or autotransformer that reaches a steady state, whereby the converter gain does not depend on the specific duration of this On state time.

However, in an alternative embodiment, the gain of the electrical power converter can be regulated by using a leakage inductance of the power transformer or autotransformer or added inductances in series, thereby changing the duty cycle of the power switches and/or the switching frequency, wherein the On time of the switches is not enough to reach a steady state of the current flowing through the power switches within a switching cycle.

The electrical power converter of this invention and the referred three-power-terminal power switch device can be implemented using a semiconductor technology selected among Si, GaN, SiC, or other semiconductors including one or more of the following components: junctions or heterojunctions, hetero-structures, piezoelectric structures, metal-oxide-semiconductor field-effect transistor, an insulated gate bipolar transistor, a bipolar junction transistor, a gate turn-off thyristor or a combination thereof.

Other features of the invention will be described in detail in the following.

BRIEF DESCRIPTION OF THE FIGURES

FIG. 1 schematically shows the concepts of electrical power transfer between a DC energy source and a load, in a conventional electrical power converter, more specifically according to a switched mode power supply (SMPS), including two power switches, a first one acting as an inverting power switch and a second one acting as a rectifying power switch, wherein in operation one power switch is in an On state and the other is in an Off state or vice versa.

FIG. 2A shows an embodiment of a power device of the prior art with two power switches.

FIG. 2B illustrates an embodiment of a power device similar to the one of FIG. 2A with a dual power switch configuration.

FIG. 3A schematically illustrates the concepts of electrical power transfer using the electrical power converter of the invention, i.e. a Direct Electrical power converter, DPX, showing the involved power switches that are simultaneously activated providing only power transfer through a DC path, without generation of AC power to realize the power conversion.

FIG. 3B, illustrates the duty cycles of the involved power switches that are simultaneously activated.

FIG. 4 shows one embodiment of the invention, in which the power switches are both in On state or both in Off state simultaneously an in which a first and a second power switches are integrated in a single structure involving three power terminals, forming a three-power-terminal power switch (3PTPS).

FIGS. 20 and 21 show an electrical power converter comprising the integration of a Buck converter with a DPX converter of this invention, forming a three port Buck-DPX regulated converter.

DETAILED DESCRIPTION OF THE INVENTION

Figure 3C:
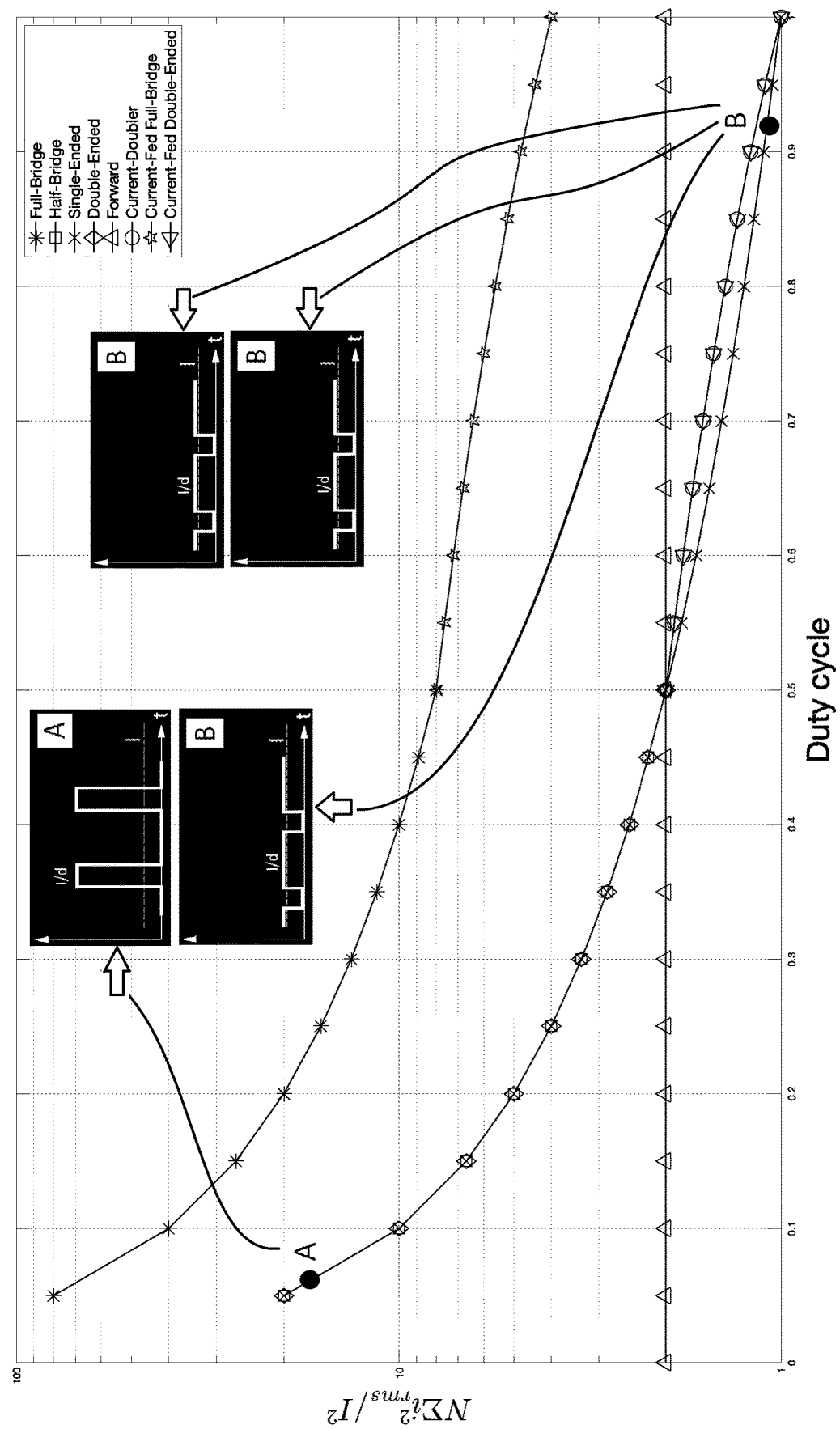
FIG. 3C, illustrates a figure of merit of the inverting and rectifying combinations of power switches as a function of their duty cycle.
Figure 5A:
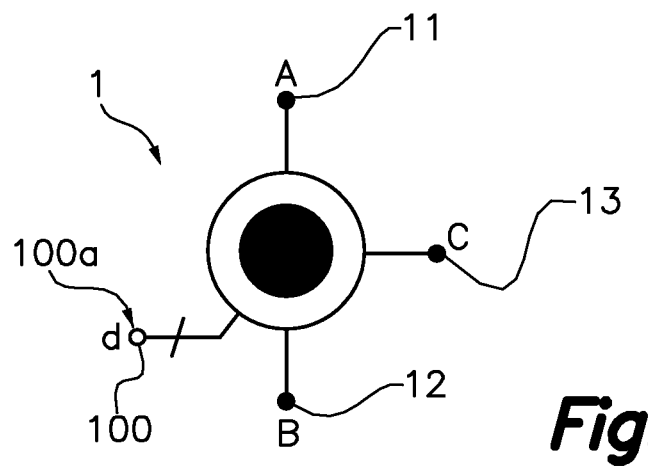
FIG. 5A shows an electrical symbol for the three-power-terminal power switch of this invention.
Figure 5B:
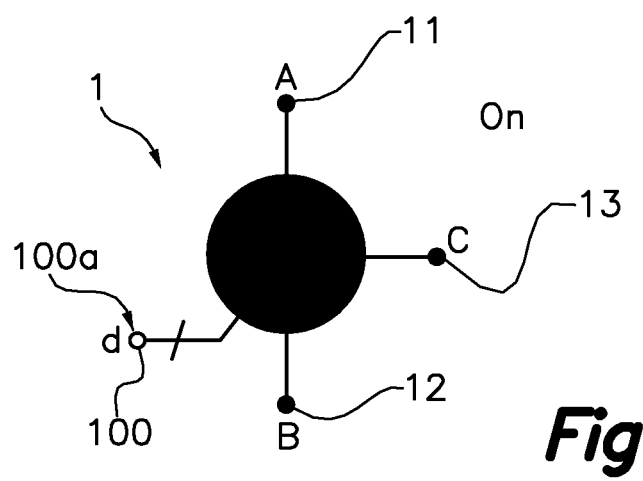
FIG. 5B shows this electrical symbol of the three-power-terminal power switch in an On state.
Figure 5C:
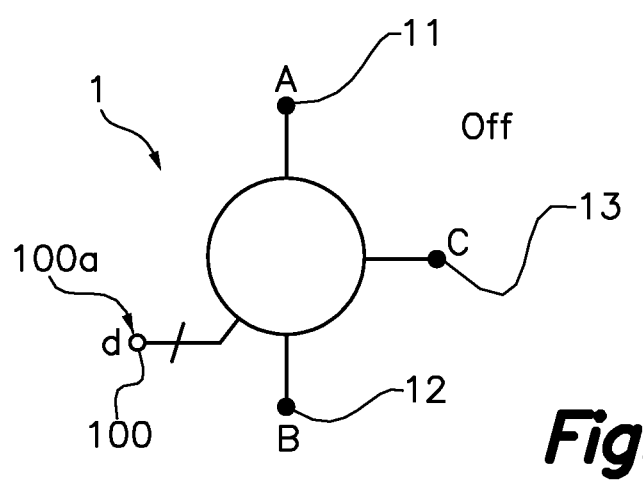
FIG. 5C shows this electrical symbol of the three-power-terminal power switch in an Off state.

The invention refers to an electrical power converter, configured to connect a primary port with a secondary port, the primary port including a DC energy source or an AC energy source and the secondary port including a DC load or an AC load, comprising, as known in the art:
  a transformer or autotransformer, and optionally a passive network of capacitors, inductors, or resistors, connected to a plurality of nodes of the electrical power converter;
  at least one first power switch between two nodes of said plurality of nodes, the first power switch having two power terminals and at least a first control terminal; and
  at least one second power switch between other two different nodes of said plurality of nodes, the second power switch having two power terminals and at least a second control terminal,
wherein said first power switch and said second power switch are configured to interconnect the cited plurality of nodes.

The present invention proposes a completely different approach providing an electrical power converter 2 that results from several topologies and in which the first and the second power switches 31, 32 are configured to be operated simultaneously under the action of a logic control signal 100a providing a conducting status with all the power switches 31, 32 being simultaneously in an On state or with all the power switches 31, 32 in an Off state, connecting or disconnecting said transformer or autotransformer to said primary port and said secondary ports simultaneously, and forming a Direct Electrical power converter, DPX.

In this way, in a given period of time in which said power switches 31, 32 are simultaneously activated, an On state time of all the power switches 31, 32 provides a conduction duty cycle even higher than fifty percent in all the power switches 31, 32, thereby reducing a RMS value of a current flowing through the power switches 31, 32 for a given average converter output current.

The first and second power switches 31, 32, can be connected in series, in parallel or as per a combination of series and parallel.

In an embodiment, the first and second power switches 31, 32 are integrated in a single structure of three power terminals 11, 12, 13, see FIG. 4, and a single control gate of the device 100 substitutes the control gates of the first and second power switches 101, 102 (see prior art embodiments in FIGS. 2A and 2B) and simultaneously operates both power switches 31, 32, so that the first and second power switches 31, 32 are turned On or turned Off simultaneously connecting or disconnecting different nodes under the action of a single logic control signal 100a, applied to the single control gate of the device 100. Therefore, a three-power-terminal power switch device 1 is obtained.

Voltages and currents in the three power terminals may be positive or negative, this implying a bidirectionality in voltage and current; therefore, power may flow from an input port to an output port of the device or vice-versa.

In an embodiment, the first and second power switches 31, 32 are not connected together.

Because of the simultaneous operation of the first and second power switches 31, 32, the Figure of Merit of the proposed electrical power converter 2 is optimized.

As previously indicated, in the proposed electrical power converter 2, additional control means are provided to provide an additional timing control, allowing to advance or delay the logic control signal applied to each of the power switches during the power switch transitions between said common On and Off states, to reduce switching losses.

Figure 6:
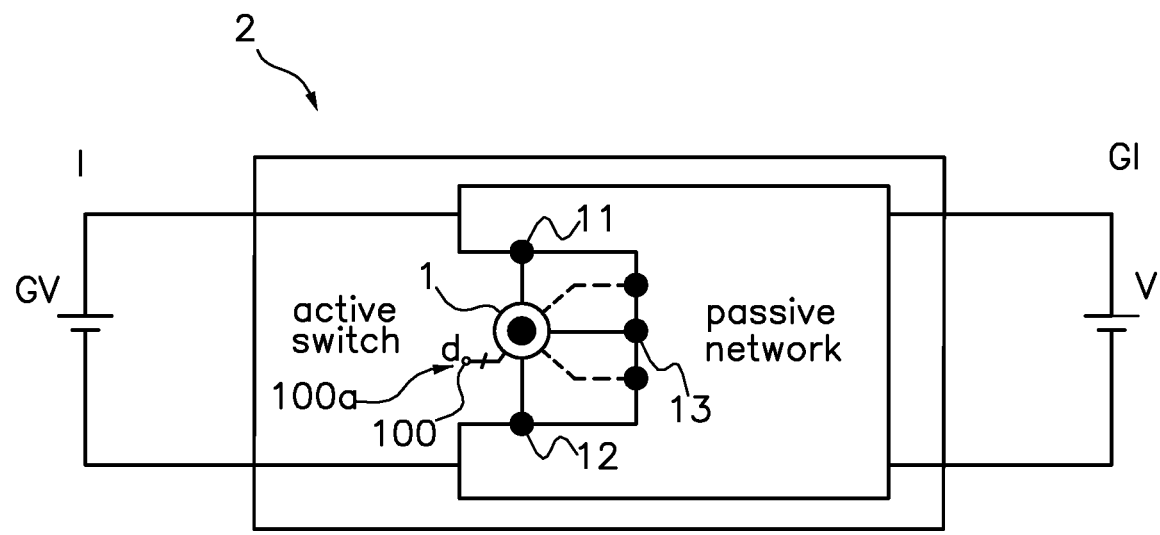
FIG. 6 illustrates a circuit of an electrical power converter according to this invention with a three-power-terminal power switch or including more power switches, indicated in a dotted line.
Figure 7A:
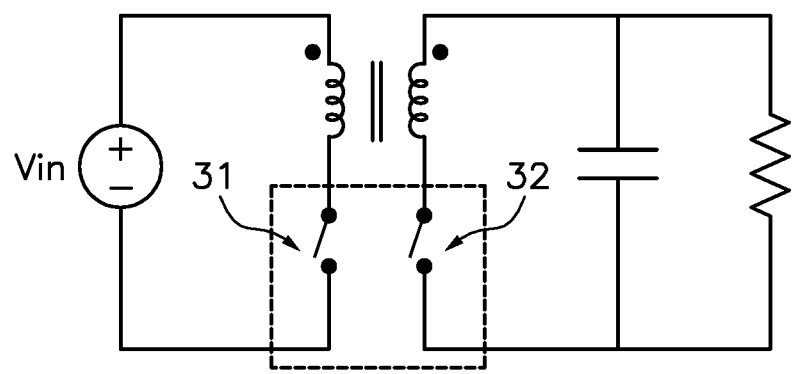
FIG. 7A shows an embodiment of a circuit of an electrical power converter with a transformer including two power switches that are configured to be operated simultaneously, according to this invention.
Figure 7B:
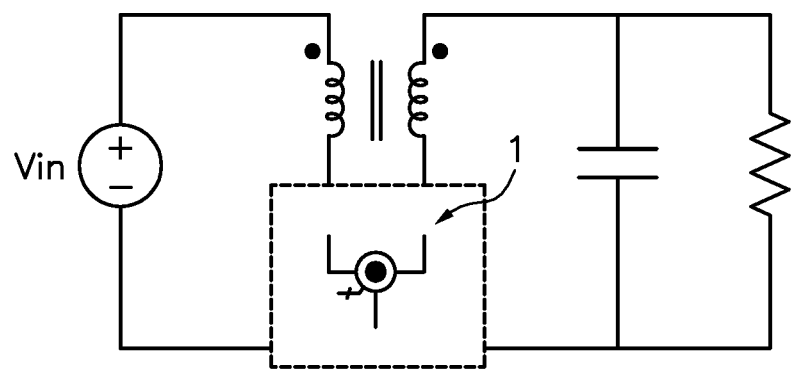
FIG. 7B is equivalent to FIG. 7A using a 3PTPS for the power switches.
Figure 7C:
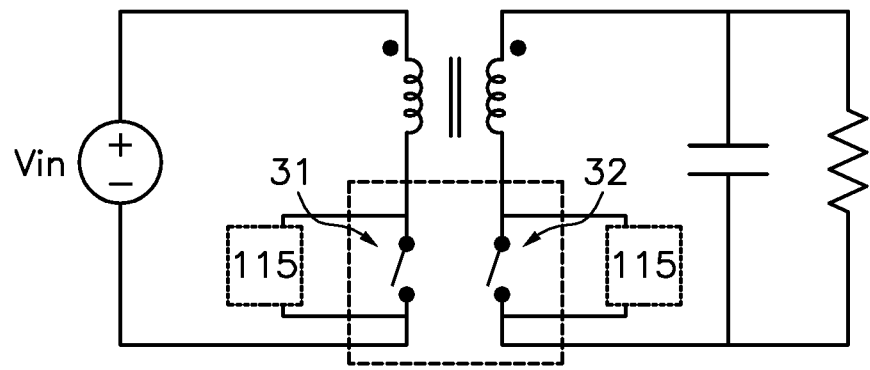
FIG. 7C is shows the embodiment illustrated in FIG. 7A including active clamps in parallel with primary and secondary switches to control the peak voltage of the switches and to command the current in transformer windings hence dynamically controlling the power conversion.
Figure 8A:
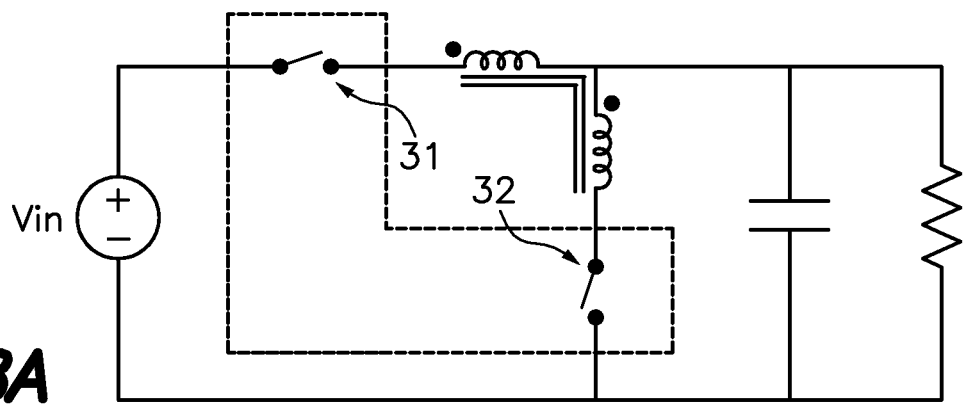
FIG. 8A shows a circuit of one embodiment with autotransformer including two power switches that are configured to be operated simultaneously, according to this invention.
Figure 8B:
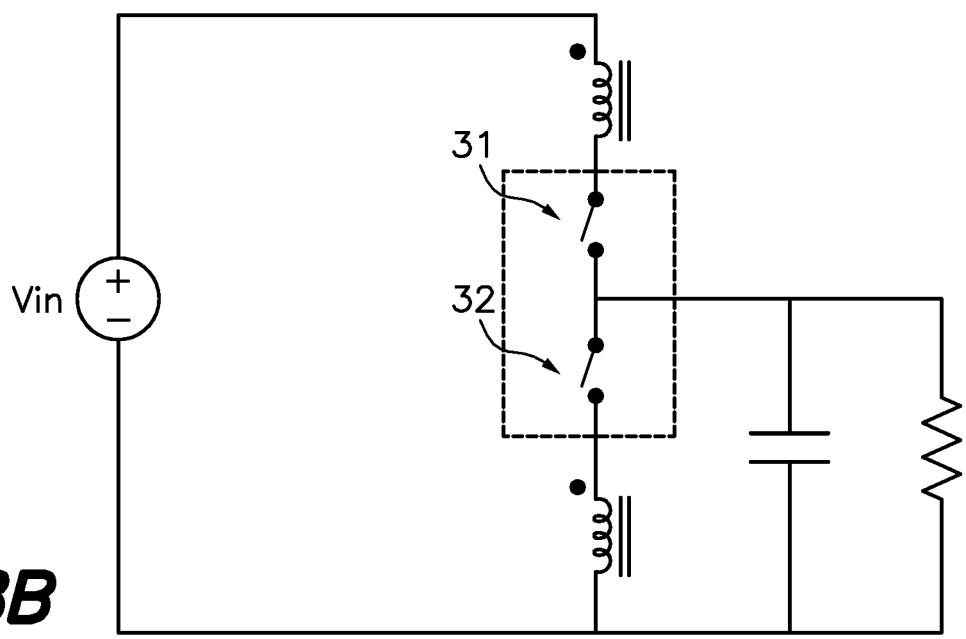
FIG. 8B illustrates the circuit of the FIG. 8A in another arrangement with autotransformer.
Figure 8C:
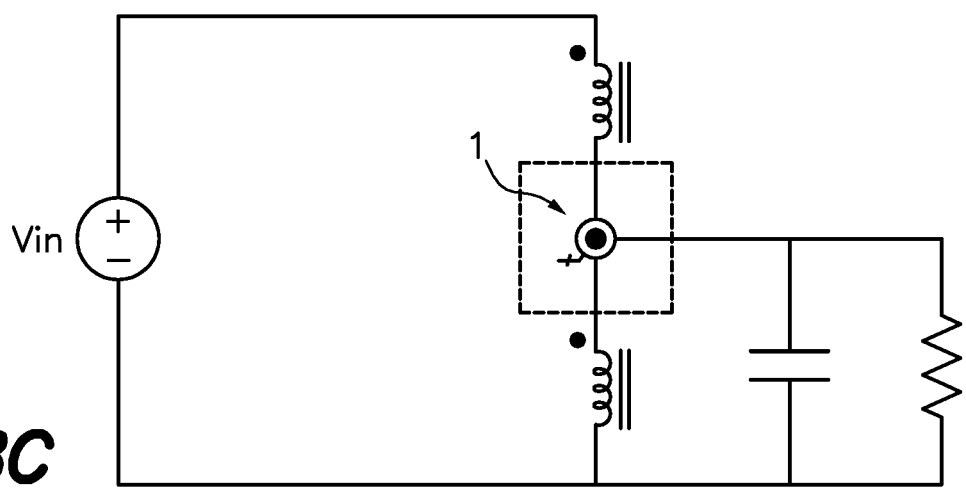
FIG. 8C corresponds to the circuit of the FIG. 8B with using a three-power-terminal power switch device (3PTPS).
Figure 9:
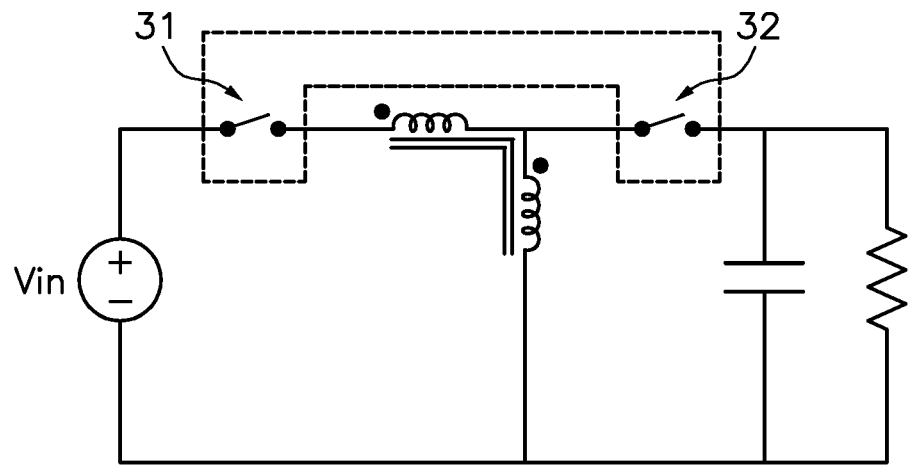
FIG. 9 is another embodiment of a circuit with autotransformer including two power switches that are configured to be operated simultaneously, according to this invention.
Figure 10:
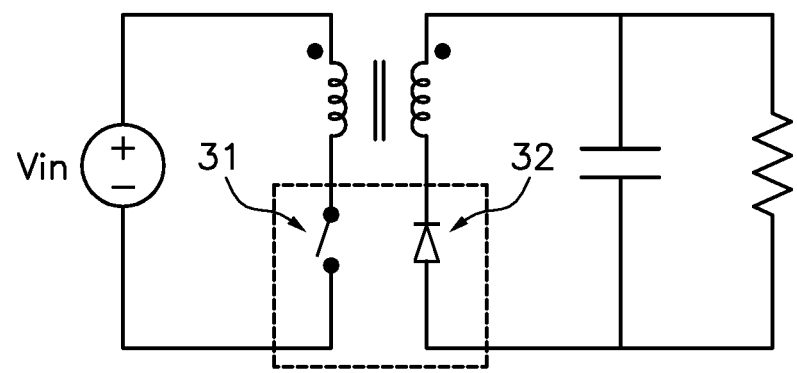
FIG. 10 is an embodiment comprising one controlled switch implemented with a transistor and one non-controlled switch implemented with a diode.
Figure 11A:
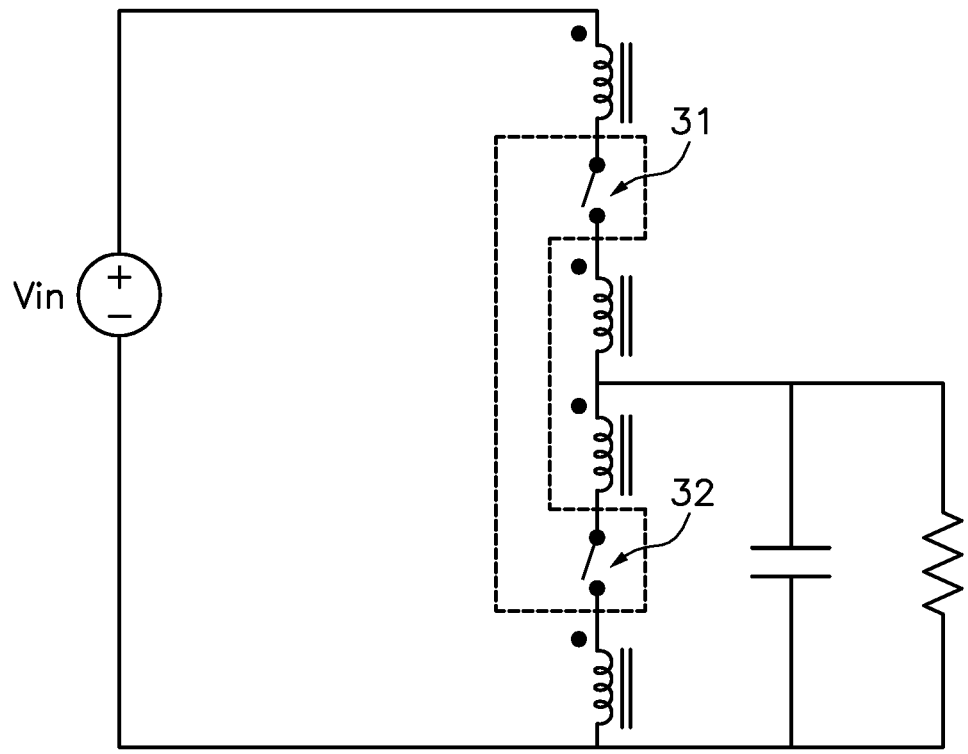
FIG. 11A shows another embodiment with autotransformer including two power switches that are configured to be operated simultaneously, according to this invention, where one power switch is included between the windings or part of the windings of the autotransformer coupled in the same magnetic structure.
Figure 11B:
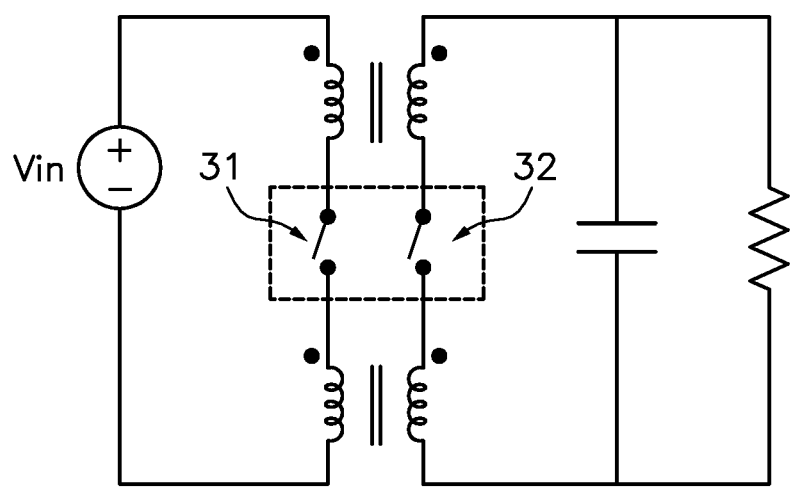
FIG. 11B shows the circuit of the FIG. 11A with transformer and isolation, instead of an autotransformer.
Figure 12A:
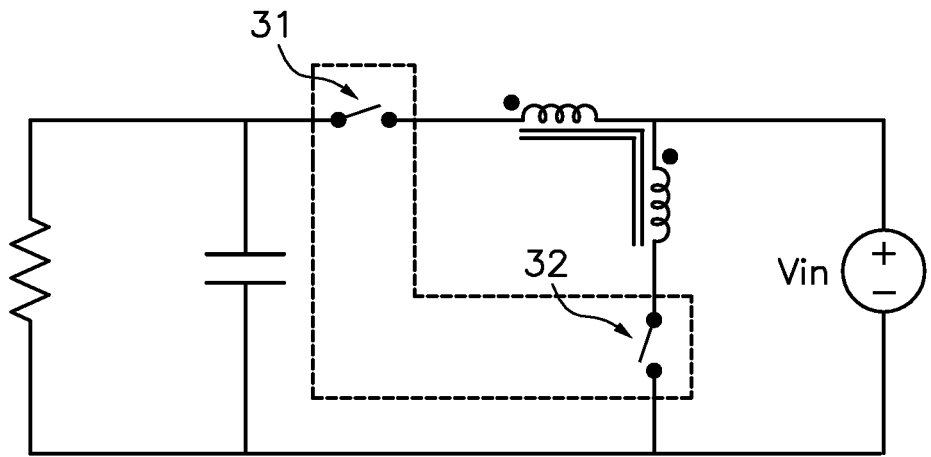
FIG. 12A presents the same embodiment of the circuit of FIG. 9, with autotransformer including two power switches that are configured to be operated simultaneously according to this invention, but in which energy flows in an opposite direction evidencing the bidirectionality feature of the electrical power converter.
Figure 12B:
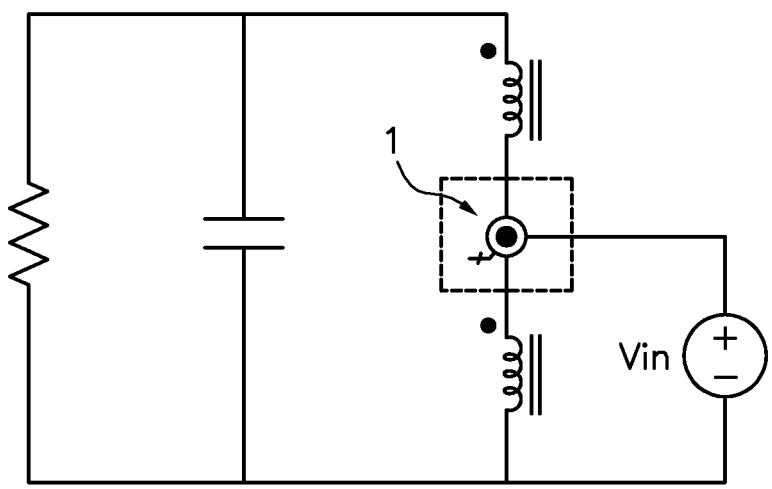
FIG. 12B shows the circuit of the FIG. 12A with a 3PTPS device.
Figure 13A:
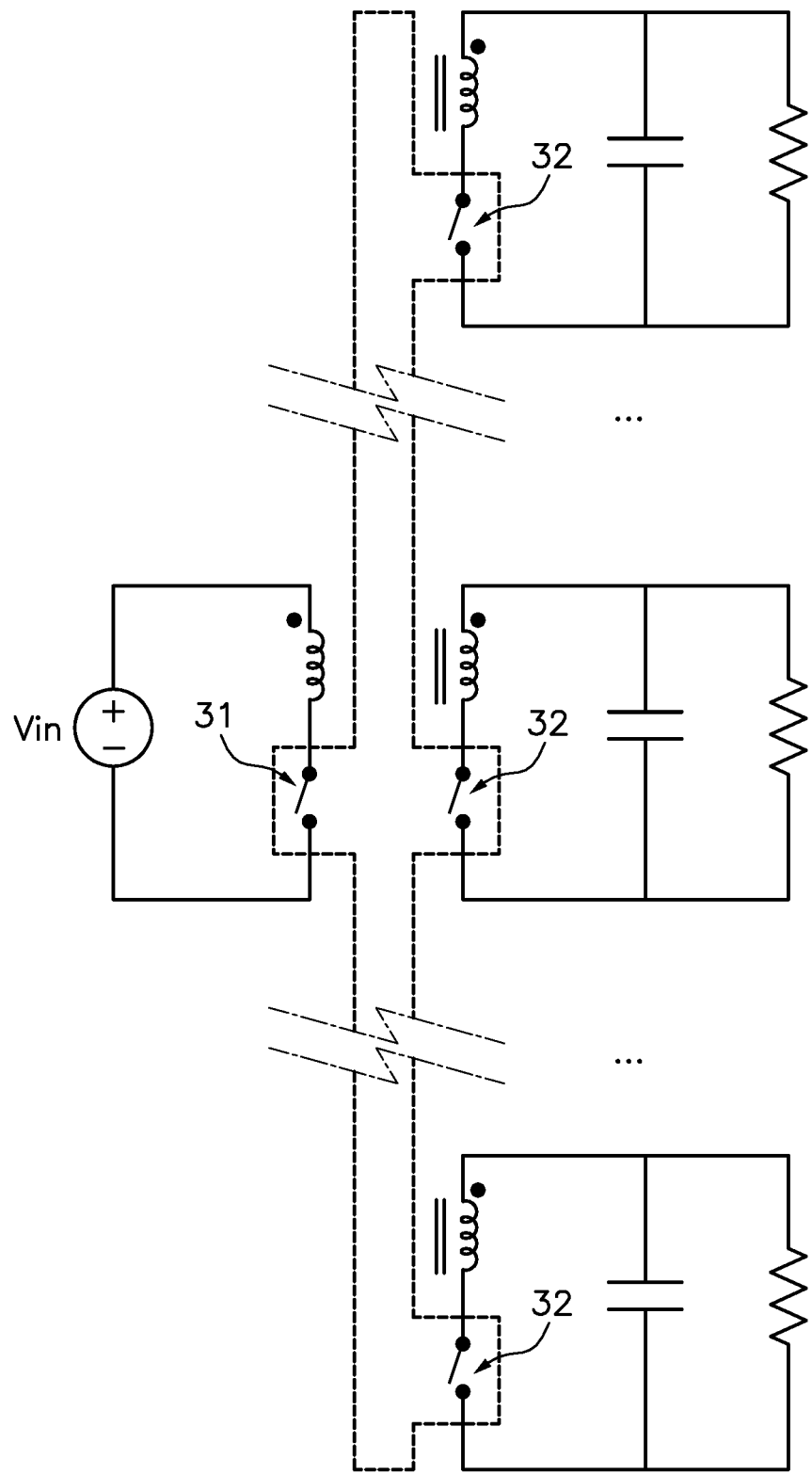
FIG. 13A shows a circuit with transformer and multiple outputs including two power switches that are configured to be operated simultaneously, according to this invention.
Figure 13B:
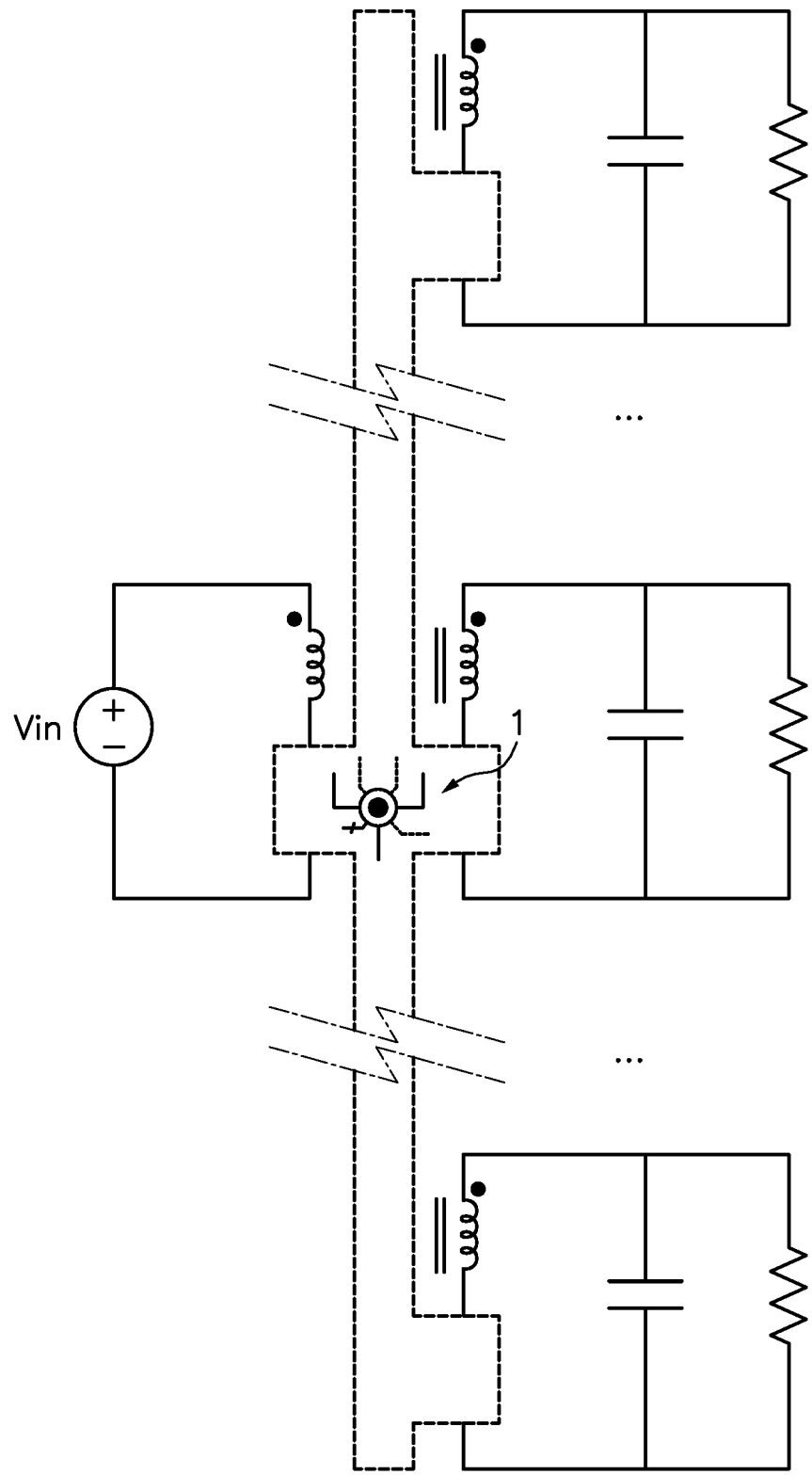
FIG. 13B is the circuit of FIG. 13A with a 3PTPS device.

The gain of the electrical power converter 2 of this invention is based on energy transfer through a transformer or autotransformer, see FIG. 6, wherein the electrical power converter 2 has voltage and current gain with or without regulation.

As shown in FIG. 3A, in the proposed electrical power converter 2, the power may flow directly from input to output, through an auto-transformer.

Furthermore, the electrical power converter 2 is configured to operate in a quasi-static manner composed of quasi-static DC-DC cells, including two power switches or more.

The proposed electrical power converter 2 can further include control means adapted to:
  configure the Off time of all the power switches 31, 32 by means of adjusting the referred logic control signal, such that at least one power switch of the at least two power switches 31, 32 is/are turned On once its own voltage is near or equal to zero;
  configure the On time of all the power switches 31, 32 by means of adjusting the referred logic control signal (such that at least the second power switch 32 is turned Off with some delay with respect to the first power switch 31, in such a way that the second power switch 32 is turned Off once its own current is near or equal to zero; and adjust the duty cycle of the power switches 31, 32 to maintain the peak voltage of the power switches 31, 32 under a given constraint.

Figure 17:
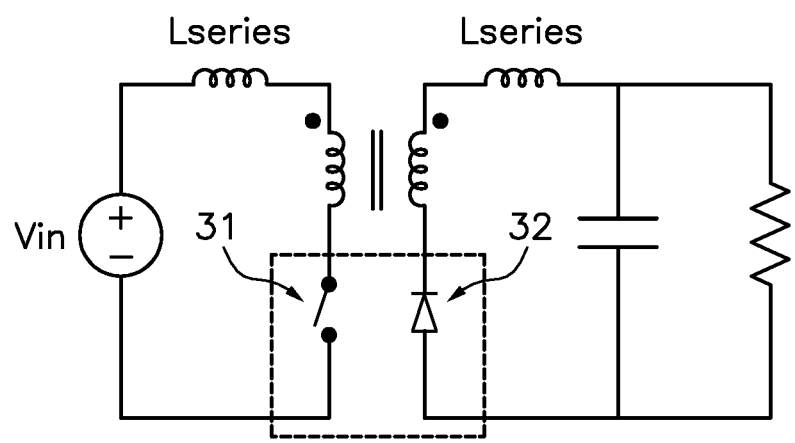
FIG. 17 is an embodiment as the one in FIG. 10 with the addition of leakage inductances in series allowing to regulate the gain of the converter.
Figure 18:
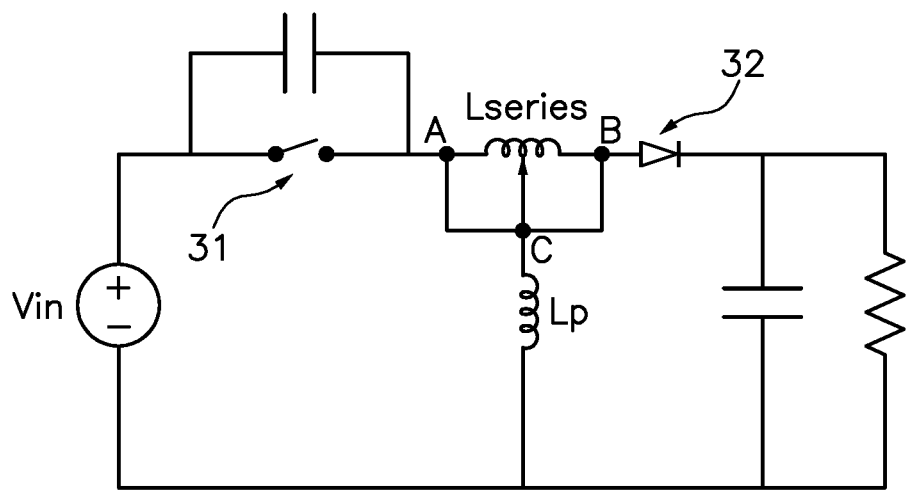
FIG. 18 is another equivalent circuit of an alternative embodiment.
Figure 19:
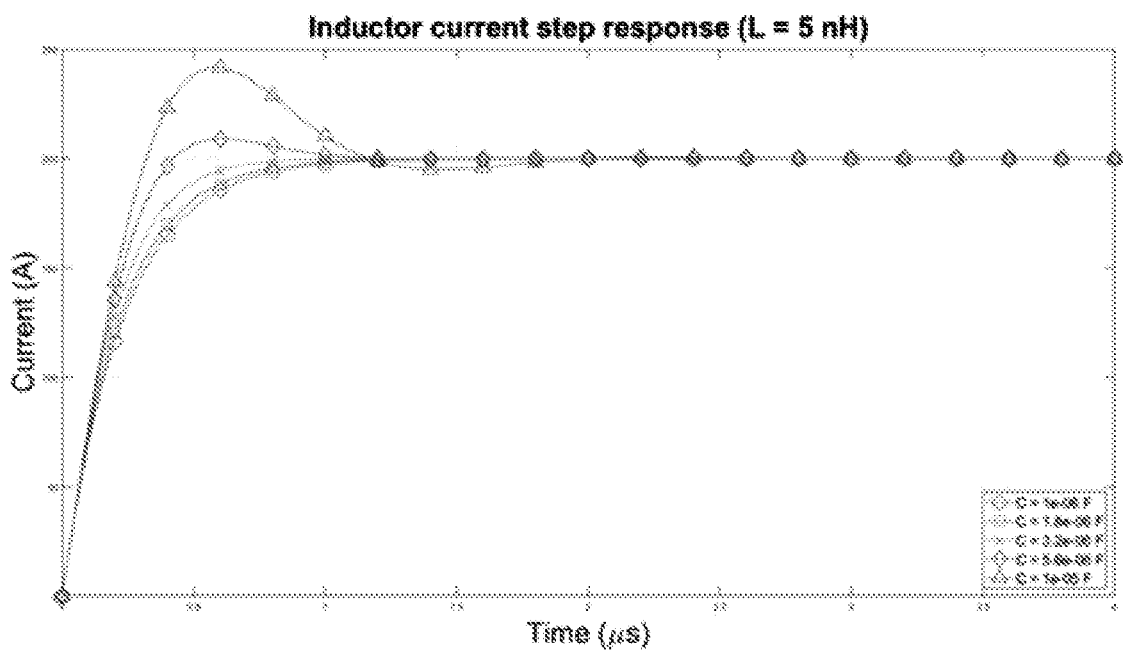
FIG. 19 a graph illustrating several curves of current versus time, in the transformer or autotransformer, in response to the effect of different values of different parasitic capacitances illustrating that the On time may be long enough so that voltage gain is not regulated or short enough as to provide charge control and hence voltage regulation. Other curves can be obtained in response to the effect of different values of parasitic inductances.

In an embodiment, the cited control means further include a leakage inductance (see FIG. 17) of the power transformer or autotransformer or added inductances in series configured to adapt the gain of the electrical power converter 2 to be regulated by changing the duty cycle of the power switches 31, 32 and/or switching the frequency, wherein the On time of the switches 31, 32 is not enough to reach a steady state of the current flowing through the power switches 31, 32 within a switching cycle.

ZVS Zero Voltage Switching:

In the electrical power converter 2 of this invention, the single logic control signal 100a is adjusted such that at least one power switch 31 of the at least two power switches 31, 32 is turned On once the voltage in the second power switch 32 is near or equal to zero, Zero Voltage Switching, ZVS, and wherein voltage or current in the second power switch 32 may be sensed or calculated to implement a timing sequence according to which during the On time of the first power switch 31, the magnetizing current increases and during the Off time a resonance occurs, in which the energy stored in the magnetizing inductance is transferred to capacitances C1 and C2 increasing their voltage to a maximum and returning back to zero, in a resonant fashion, and wherein the Off times in the first power switch 31 and in the second power switch 32 are determined "sensing" the voltage or calculating by other means the voltage in first power switch 31 and second power switch 32. Voltage or current in the power switches or equivalent may be sensed or calculated to implement this timing sequence.

Figure 14:
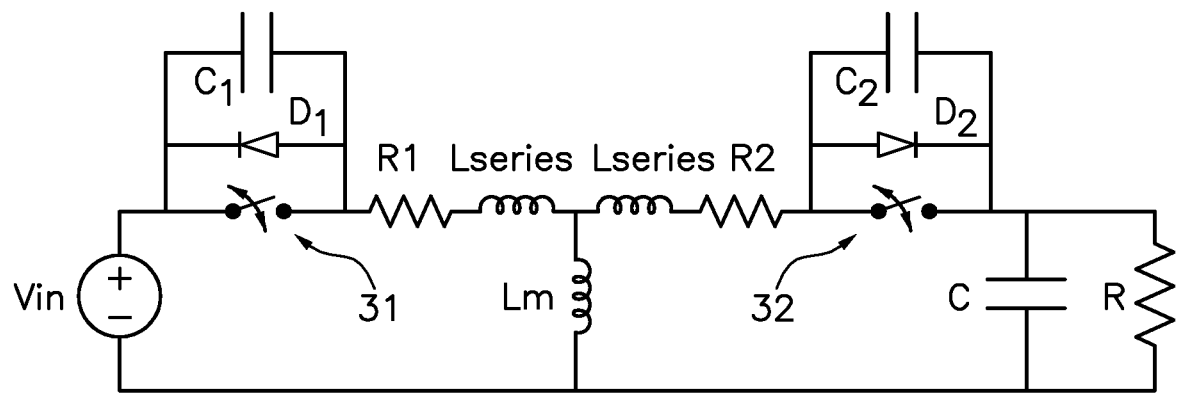
FIG. 14 shows an equivalent circuit of an electrical power converter of the invention including two power switches that are configured to be operated simultaneously and the parasitic or added elements of the electrical power converter.

In order to understand how ZVS is achieved, the circuit is simplified, as can be seen in FIG. 14. When the power switches 31, 32 open at the same time, the transformer is demagnetized through the parasitic capacitors in a resonant way.

This resonance is caused by the magnetization inductance and the parasitic capacitors, so, referring the capacity of the power switch form the secondary to the primary we can express with next formula:

$$f_{osc} = \frac{1}{2\pi\sqrt{L_m(C1//C2)}}$$

A resonance is produced between the magnetizing inductance of the magnetic components and the capacitance either parasitic or intentionally added in parallel with the power switch, which equivalent circuit is depicted in FIG. 14:

during the On time of S1 and S2, the magnetizing current increases;

during the Off time a resonance occurs, in which the energy of the magnetizing inductance is transferred to the capacitances C1 and C2 increasing their voltage to a maximum and returning back to zero, in a resonant fashion.

Switches S1 and S2 are turned On when their voltage across their power terminals is reduced to the vicinity of zero known in the literature as "Zero Voltage Switching".

The Off time in S1 and S2 is determined "sensing" the voltage or "estimating" or calculating by other means the voltage in S1 and/or S2.

Figure 16:
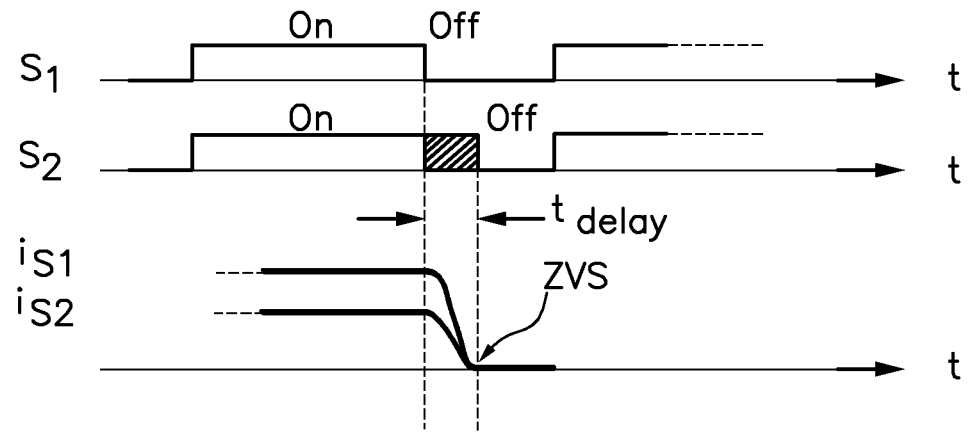
FIG. 16 is a graph illustrating the behaviour of the electrical power converter of this invention showing a Zero Current Switching (ZCS) detail.

ZCS Zero Current Switching:

FIG. 16 illustrates this working mode of the electrical power converter 2 of this invention, wherein the first power switch 31 is turned Off with some delay with respect to the second power switch 32, in such a way that the second power switch 32 is turned Off once the current is near or equal to zero, Zero Current Switching, ZCS, and wherein voltage or current in the first power switch 31 may be sensed or calculated to implement a timing sequence according to which currents i1 and i2 start decreasing when the first power switch 31 turns to the Off state and the second power switch 32 is maintained in On state during some delay time, $t_{delay}$, after the first power switch 31 is turned Off until current flowing through the second power switch 32 is reduced to the vicinity of Zero known in the literature as Zero Current Switching, ZCS. The time delay, $t_{delay}$, between the first power switch 31 turn Off and second power switch 32 turn Off is determined sensing the current or calculating by other means the current in the second power switch 32.

In other words, one power switch is turned Off with some delay with respect to the other, in such a way that it is turned Off once the current is near or equal to zero, Zero Current Switching, ZCS, also the voltage or current in the power switch or equivalent may be sensed to implement this timing sequence.

Zero Current Switching ZCS can be obtained in a simple way just turning Off the primary power switch a little earlier than the secondary power switch.

Figure 15:
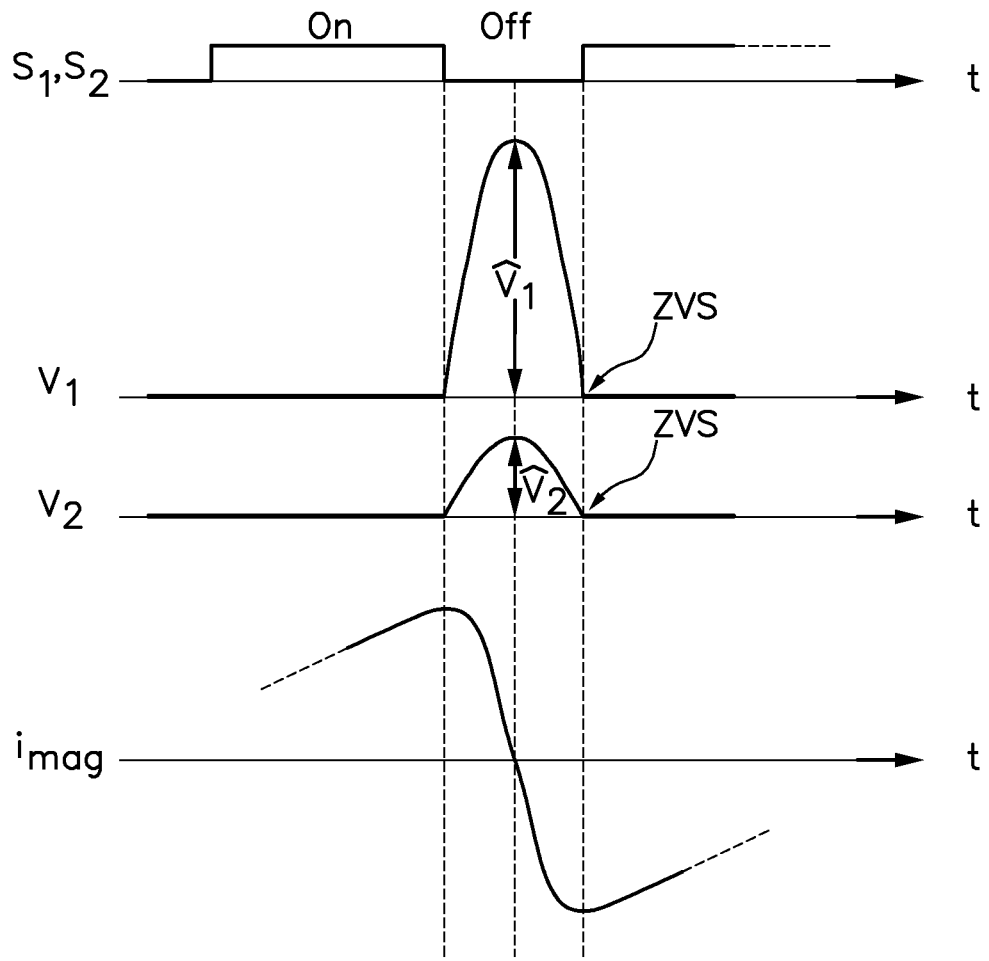
FIG. 15 is a graph illustrating the behaviour of the electrical power converter of this invention showing a Zero Voltage Switching (ZVS) detail.

The current will stop flowing through the secondary in this short time so the secondary power switch will not turn Off with the high output current across it, as can be seen in FIG. 15.

Currents i1 and i2 start decreasing when logic control signal of S1 turns to the Off state.

Logic control signal of S2 is maintained in On state during some delay time $t_{delay}$ after S1 is turned Off until current flowing through the power switch S2 is reduced to the vicinity of Zero known in the literature as Zero Current Switching, ZCS.

The time delay $t_{delay}$ between S1 turn Off and S2 turn Off is determined "sensing" the current or "calculating" by other means the current in S2.

Details about results in known topologies implemented by the principles of this invention are following detailed.

| TOPOLOGY | $N\sum i_{rms_j}^2$ | $N\sum i_{rms_j}^2 / I_{out}^2$ | $V_{max}$ | $V_{max}/V_{out}$ | DUTY CYCLE RANGE |
|---|---|---|---|---|---|
| Full Bridge | $\dfrac{4I_{in}^2}{D}$ | $\dfrac{4}{D}$ | $V_{in}$ | 1 | 0 to 0.5 |
| Half Bridge | $\dfrac{I_{in}^2}{D}$ | $\dfrac{1}{D}$ | $V_{in}$ | 1 | 0 to 0.5 |

-continued

| TOPOLOGY | $N\sum i_{rms_j}^2$ | $N\sum i_{rms_j}^2 / I_{out}^2$ | $V_{max}$ | $V_{max}/V_{out}$ | DUTY CYCLE RANGE |
|---|---|---|---|---|---|
| Single Ended | $\dfrac{I_{in}^2}{D}$ | $\dfrac{1}{D}$ | $\dfrac{V_{in}}{1-D}$ | $\dfrac{1}{1-D}$ | 0 to 1 |
| Double Ended | $\dfrac{I_{in}^2}{D}$ | $\dfrac{1}{D}$ | $2V_{in}$ | 2 | 0 to 0.5 |
| Current Fed Full Bridge | $4I_{in}^2(3-2D)$ | $4(3-2D)$ | $\dfrac{V_{in}}{2(1-D)}$ | $\dfrac{1}{2(1-D)}$ | 0.5 to 1 |
| Current Fed Double Ended | $I_{in}^2(3-2D)$ | $3-2D$ | $\dfrac{V_{in}}{1-D}$ | $\dfrac{1}{1-D}$ | 0.5 to 1 |

| TOPOLOGY | $N\sum i_{rms_j}^2$ | $N\sum i_{rms_j}^2 / I_{out}^2$ | $V_{max}$ | $V_{max}/V_{out}$ | DUTY CYCLE RANGE |
|---|---|---|---|---|---|
| Full Bridge | $\dfrac{4I_{out}^2}{D}$ | $\dfrac{4}{D}$ | $V_{out}$ | 1 | 0 to 0.5 |
| Double Ended | $\dfrac{I_{out}^2}{D}$ | $\dfrac{1}{D}$ | $2V_{out}$ | 2 | 0 to 0.5 |
| Single Ended | $\dfrac{I_{out}^2}{D}$ | $\dfrac{1}{D}$ | $\dfrac{V_{out}}{1-D}$ | $\dfrac{1}{1-D}$ | 0 to 1 |
| Forward | $2I_{out}^2$ | 2 | $\dfrac{V_{out}}{D}$ | $\dfrac{1}{D}$ | 0 to 1 |
| Full Bridge LC filter | $4I_{out}^2(3-2D)$ | $4(3-2D)$ | $\dfrac{V_{out}}{2(1-D)}$ | $\dfrac{1}{2(1-D)}$ | 0.5 to 1 |
| Double Ended LC filter | $I_{out}^2(3-2D)$ | $3-2D$ | $\dfrac{V_{out}}{1-D}$ | $\dfrac{1}{1-D}$ | 0.5 to 1 |
| Current Doubler | $I_{out}^2(3-2D)$ | $3-2D$ | $\dfrac{V_{out}}{2(1-D)}$ | $\dfrac{1}{2(1-D)}$ | 0.5 to 1 |

In an embodiment of this invention, the electrical power converter 2, DPX, of this invention further comprises the integration of a Buck converter 3 (see FIG. 20) obtaining a three port Buck-DPX 4 regulated DC-DC-DC converter shown in FIG. 21 in which the magnetizing inductance of the DPX 2 is operated as the inductance of the Buck converter 3, and the gain of the converter between input and output ports is regulated by changing the duty cycle and/or the switching frequency, wherein the power may flow from at least one port of said three ports to at least one of the other remaining ports.

Figure 22:
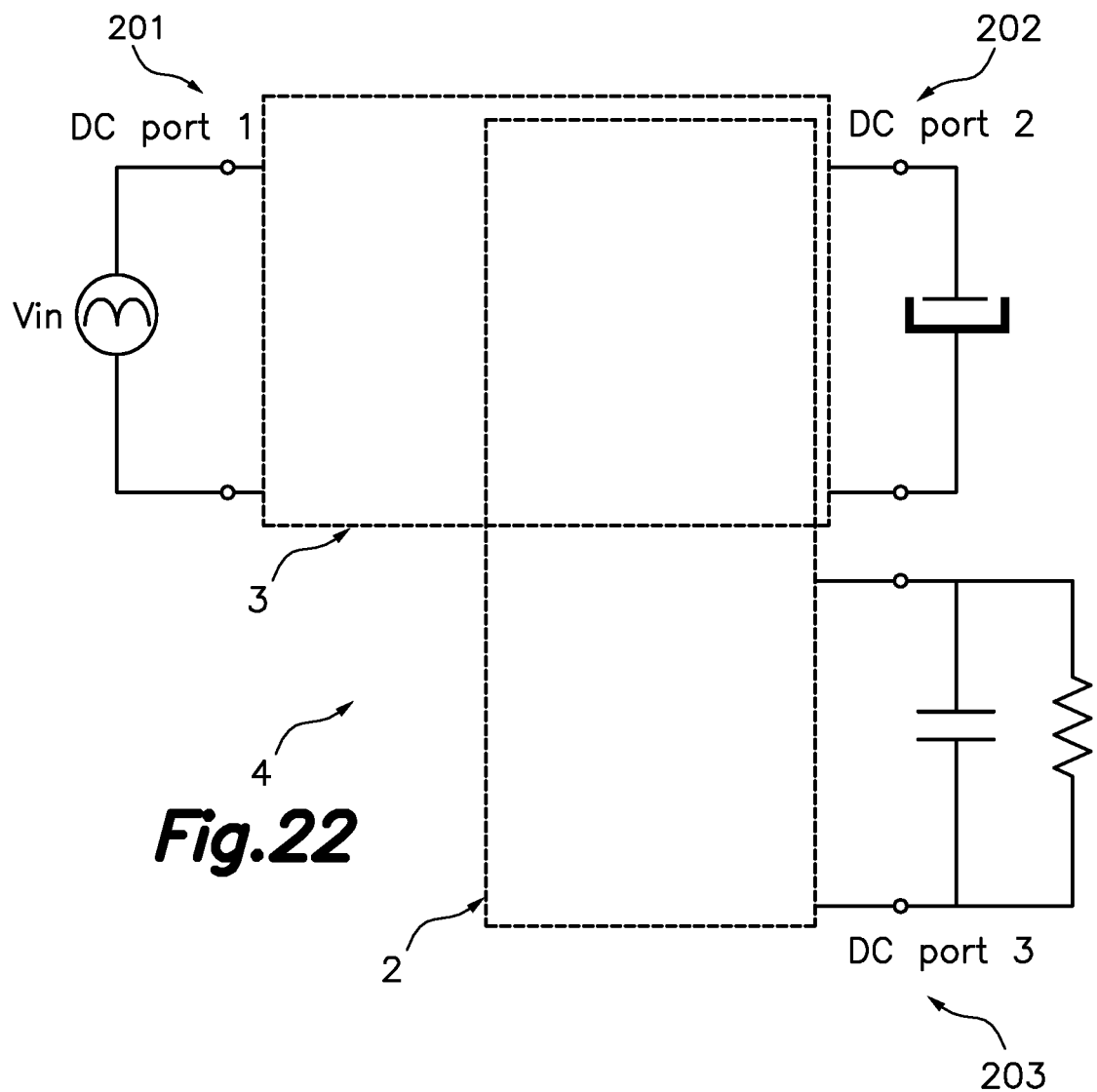
FIG. 22 shows the Three-port Buck-DPX converter operated as an "Energy buffered AC-DC power converter" in which port 2 is the energy buffer, port 1 is the rectified AC voltage and port 3 is the DC load.

In an alternative embodiment, the three port Buck-DPX 4 of FIG. 22 is a regulated AC-DC-DC converter.

With regard to the cited embodiments of FIGS. 21 and 22, the first power switch 31 of the DPX 2 and a power switch 33 of the Buck converter 3 are configured to operate the three port Buck-DPX 4 as quasi-static DC-DC cells, wherein first DC input port 201 receives DC quasi static voltage from a rectified high power factor AC voltage source, second DC port 202 is configured to act as an energy buffer and a third DC output port 203 is configured to have tight DC voltage regulation.

Figure 23A:
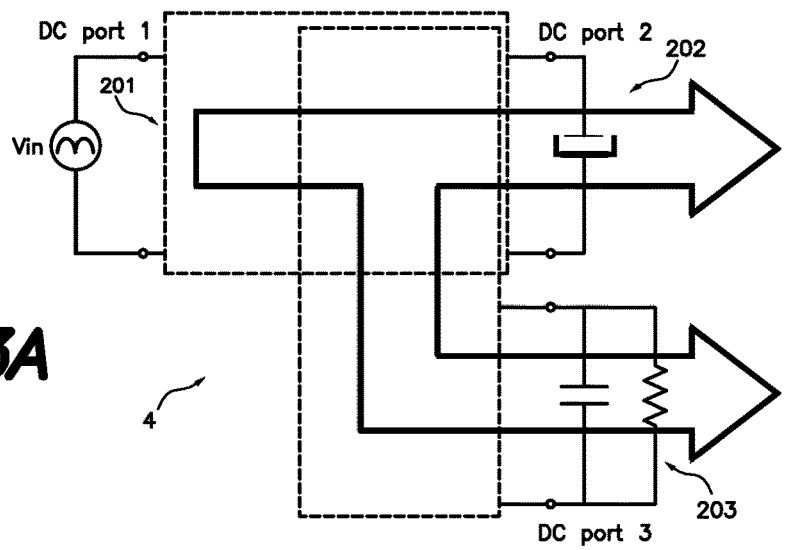
FIG. 23A shows the 3-port power converter of FIG. 22 illustrating the power flow from the rectified AC voltage (DC port 1) to the energy buffer (DC port 2) and the DC load (DC port 3).
Figure 23B:
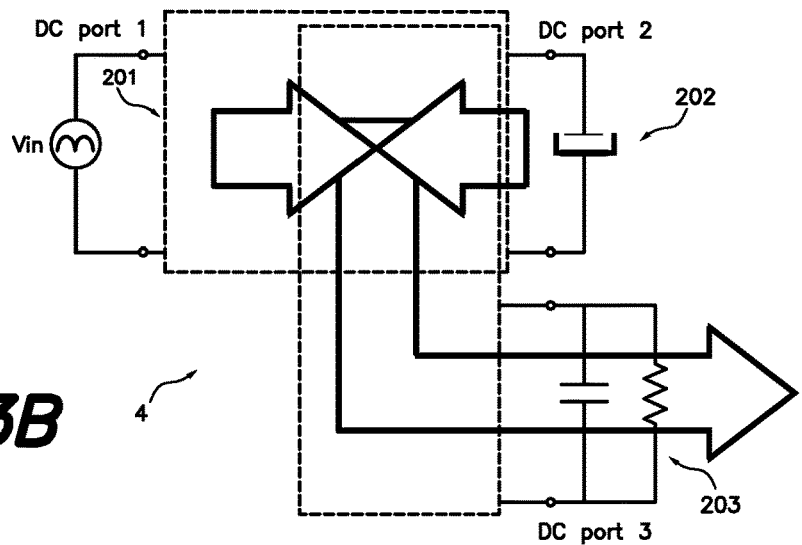
FIG. 23B show the 3-port power converter of FIG. 22 illustrating the power flow from the rectified AC voltage (DC port 1) and the energy buffer (DC port 2) to the DC load (DC port 3).
Figure 23C:
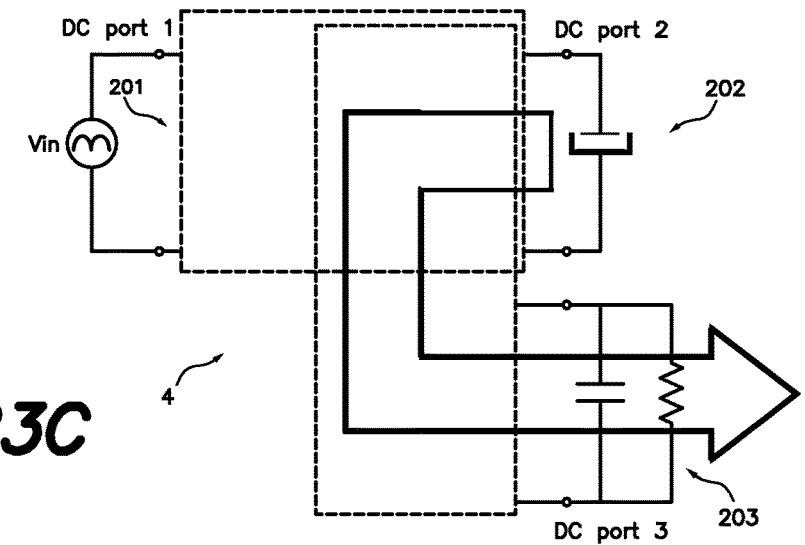
FIG. 23C show the 3-port power converter of FIG. 22 illustrating the power flow from the energy buffer (DC port 2) to the DC load (DC port 3).

Also, with regard to the cited embodiments of FIGS. 21 and 22, the invention proposes control means of the switching frequency and duty cycle of said power switches 31 and 33 to provide a power flow according to three different operative power pathways:

A. from the first DC input port 201 the power flows through the second DC port 202 and through the third DC output port 203 (see FIG. 23A);
B. from the first DC input port 201 and the second DC port 202 the power flows to the third DC output port 203 (see FIG. 23B);
C. from the second DC port 202 the power flows to the third DC output port 203 (see FIG. 23C).

Figure 24:
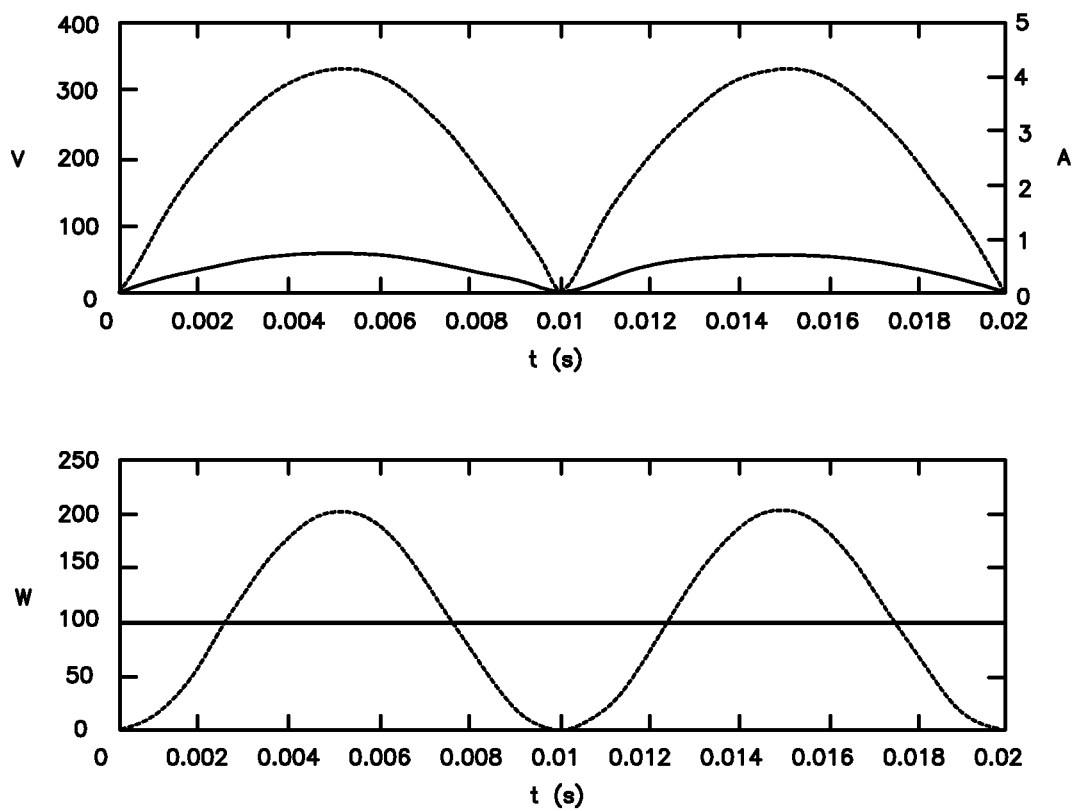
FIG. 24 shows example waveforms of the voltage (dashed line) and input current in the rectified AC (DC port 1) and the resulting pulsating input power (dashed line) which is buffered and converted into the illustrated constant DC power in the DC port 3.

In a further embodiment, in the three port Buck-DPX 4 the energy buffer includes one or more capacitors configured to be dynamically adjusted to minimize indirect power with a voltage mean value in relation with the RMS value of the input voltage. FIG. 24 shows the AC line voltage for the high voltage range of the universal input voltage (85-264 Vac).

What is claimed is:

1. An electrical power converter, configured to connect a primary port with a secondary port, the primary port comprising a DC energy source and the secondary port comprising a DC load, the electrical power converter comprising:

a transformer or autotransformer connected to each one of a plurality of nodes of the electrical power converter;

at least one first power switch disposed between two nodes of the plurality of nodes, the at least one first power switch comprising two power terminals, at least a first control terminal, and a first capacitance in parallel; and at least one second power switch disposed between two different nodes of the plurality of nodes, the at least one second power switch comprising two power terminals, at least a second control terminal, and a second capacitance in parallel;

the at least one first power switch being arranged on a primary side of the transformer or autotransformer and the at least one second power switch being arranged on a secondary side of the transformer or autotransformer, the at least one first power switch and the at least one second power switch being configured to connect the primary port to the secondary port through the transformer or autotransformer;

the at least first control terminal and the at least second control terminal being either different terminals or a single terminal;

the at least one first power switch and the at least one second power switch being configured to be operated simultaneously under an action of a logic control signal configured to provide a conducting status with the at least one first power switch and the at least one second power switch being simultaneously in an On state or in an Off state, the at least a first power switch and the at least one second power switch being configured to simultaneously connect or disconnect the transformer or autotransformer to the primary port and the secondary port and to form a Direct Electrical power converter, DPX;

in a given period of time, in which the at least one first power switch and the at least one second power switch are simultaneously activated, an On state time of the at least one first power switch and the at least one second power switch provides a direct power path from the DC energy source to the DC load through the transformer or autotransformer with a conduction duty cycle range in the at least one first power switch and the at least one second power switch higher than fifty percent, thereby reducing an RMS value of a current flowing through the at least one first power switch and the at least one second power switch for a given average converter output current; and a conduction duty cycle of the at least one first power switch and the at least one second power switch is adjusted to maintain a peak voltage of the at least one first power switch and the at least one second power switch under a given constraint, so that a transformer or autotransformer magnetization during the On state is reset during the Off state using a resonance between a magnetizing inductance of the transformer or autotransformer and the first capacitance in parallel with the at least one first power switch and the second capacitance in parallel with the at least one second power switch.

2. The electrical power converter according to claim 1, wherein the at least one first power switch and the at least one second power switch are integrated in a single structure of three power terminals, and connected together in a common node, providing a three-power-terminal power switch device, and a single control terminal of the three-power-terminal power switch device substitutes the control terminals of the at least one first power switch and the at least one second power switch, the logic control signal being applied to the single terminal.

3. The electrical power converter according to claim 1, further comprising a control element configured to provide an additional timing control allowing to advance or delay the logic control signal applied to the at least one first power switch and to the at least one second power switch during power switch transitions between the On and Off states, to reduce switching losses.

4. The electrical power converter according to claim 1, the at least one first power switch and the at least one second power switch are controlled switches implemented with transistors or comprise at least one controlled switch implemented with a transistor and at least one non-controlled switch implemented with diodes.

5. The electrical power converter according to claim 1, the On state time is sufficient to provide a current through a secondary winding of the transformer or autotransformer that reaches a steady state, whereby a converter gain does not depend on a specific duration of the On state time.

6. The electrical power converter according to claim 1, being implemented by using a semiconductor technology selected among Si, GaN, SiC, or by using semiconductors including one or more of the following components: junctions or hetero-junctions, hetero-structures, piezoelectric structures, metal-oxide-semiconductor field-effect transistor, an insulated gate bipolar transistor, a bipolar junction transistor, a gate turn-off thyristor or a combination thereof.

7. The electrical power converter according to claim 1, wherein the at least one first power switch and the at least one second power switch are each inserted in windings of the transformer or autotransformer or in a part of the transformer or autotransformer.

8. The electrical power converter according to claim 1, further comprising a control element adapted to configure the Off time of the at least one first power switch and of the at least one second power switch by means of adjusting the logic control signal, such that the at least one first power switch is turned On once a voltage of the at least one first power switch is near or equal to zero.

9. The electrical power converter according to claim 1, further comprising a control element configured to adapt the On time of the at least one first power switch and the at least one second power switch by means of adjusting the logic control signal, such that the at least one second power switch is turned Off with some delay with respect to the at least one first power switch, in such a way that the at least one second power switch is turned Off once a current of the at least one second power switch is near or equal to zero or turned On with some delay to command a current delivered by the transformer.

10. The electrical power converter according to claim 9, further comprising a leakage inductance of the power transformer or autotransformer or added inductances in series configured to command the current delivered by the transformer by changing at least one of the duty cycle of the at least one first power switch and of the at least one second power switch, the delay, and a switching frequency.

11. The electrical power converter according to claim 1, further comprising a Buck converter forming a three port Buck-DPX regulated DC-DC-DC converter, a magnetizing inductance of the DPX converter is operated as an inductance of the Buck converter, and a gain of the DPX converter between input and output ports is regulated by at least one of changing the duty cycle and switching a frequency, wherein power may flow from at least one port of the three ports to at least one of the other remaining ports.

12. The electrical power converter according to claim 1, further comprising a Buck converter comprising a power switch forming a three port Buck-DPX regulated AC-DC-DC converter, a magnetizing inductance of the DPX converter is operated as an inductance of the Buck converter, and a gain of the DPX converter between input and output ports is regulated by at least one of changing the duty cycle and/or switching a frequency, wherein power may flow from at least one port of the three ports to at least one of the other remaining ports.

13. The electrical power converter according to claim 12, wherein:
   the at least one first power switch of the DPX converter and the power switch of the Buck converter are configured to operate the three port Buck-DPX as quasi-static DC-DC cells,
   a first DC input port is configured to receive a DC quasi static voltage from a rectified high power factor AC voltage,
   a second DC port is configured to act as an energy buffer, and
   a third DC output port is configured to have tight DC voltage regulation.

14. The electrical power converter according to claim 13, further comprising a control element for the switching frequency and duty cycle of the at least one first power switch of the DPX converter and of the power switch of the Buck converter of the three port Buck-DPX to provide a power flow according to three operative power pathways:
   A. from the first DC input port power is configured to flow through the second DC port and through the third DC output port;
   B. from the first DC input port and the second DC port power is configured to flow to the third DC output port;
   C. from the second DC port power is configured to flow to the third DC output port.

15. The electrical power converter according to claim 14, wherein the energy buffer includes at least one capacitor configured to be dynamically adjusted to minimize indirect power with a voltage mean value in relation with the RMS value.

16. The electrical power converter according to claim 13, wherein the DC energy source or the DC load are quasi-static DC voltages forming an AC voltage energy source or an AC load.

17. The electrical power converter according to claim 1, further comprising active clamps in parallel with the at least one first power switch and the at least one second power switch, the active clamps being configured to adjust the peak voltage thereof.

* * * * *